(12) United States Patent
Popp et al.

(10) Patent No.: US 9,698,387 B2
(45) Date of Patent: Jul. 4, 2017

(54) METHOD FOR PRODUCING AN OPTOELECTRONIC COMPONENT AND METHOD FOR PATTERNING AN ORGANIC, OPTOELECTRONIC COMPONENT

(71) Applicant: OSRAM OLED GMBH, Regensburg (DE)

(72) Inventors: Michael Popp, Freising (DE); Simon Schicktanz, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/419,964

(22) PCT Filed: Aug. 7, 2013

(86) PCT No.: PCT/EP2013/066576
§ 371 (c)(1),
(2) Date: Feb. 6, 2015

(87) PCT Pub. No.: WO2014/023781
PCT Pub. Date: Feb. 13, 2014

(65) Prior Publication Data
US 2015/0171378 A1    Jun. 18, 2015

(30) Foreign Application Priority Data

Aug. 10, 2012   (DE) .................. 10 2012 214 325

(51) Int. Cl.
*H01L 51/56* (2006.01)
*H01L 51/44* (2006.01)
(Continued)

(52) U.S. Cl.
CPC .......... *H01L 51/56* (2013.01); *H01L 51/0014* (2013.01); *H01L 51/441* (2013.01);
(Continued)

(58) Field of Classification Search
CPC .................................................... H01L 51/448
See application file for complete search history.

(56) References Cited

U.S. PATENT DOCUMENTS

| 2006/0051951 A1 | 3/2006 | Ghosh et al. |
| 2008/0309650 A1* | 12/2008 | Nishikawa .......... H01L 27/3276 345/206 |

(Continued)

FOREIGN PATENT DOCUMENTS

| CN | 101442091 A | 5/2009 |
| CN | 102362369 A | 2/2012 |

(Continued)

OTHER PUBLICATIONS

International Search Report in the PCT Application PCT/EP2013/066576 (2 pages), dated Nov. 18, 2013.
(Continued)

*Primary Examiner* — Kimberly Rizkallah
*Assistant Examiner* — Mounir Amer
(74) *Attorney, Agent, or Firm* — Viering, Jentschura & Partner mbB

(57) ABSTRACT

Various embodiments may relate to a method for producing an organic optoelectronic component, including forming a first layer on or over a substrate, the substrate including at least one contact pad of the organic optoelectronic component, at least one electrode of the organic optoelectronic component being electrically connected to the at least one contact pad, forming a second layer on or over the first layer, and removing at least the second layer in at least one region of the substrate with the first layer and the contact pad. The adhesion of the substance or of the substance mixture of the first layer on the interface with the substrate is less than the adhesion of the substance or of the substance mixture of the second layer on the interface with the substrate.

13 Claims, 9 Drawing Sheets

(51) Int. Cl.
  *H01L 51/52* (2006.01)
  *H01L 51/00* (2006.01)

(52) U.S. Cl.
  CPC ........ *H01L 51/448* (2013.01); *H01L 51/5206* (2013.01); *H01L 51/5221* (2013.01); *H01L 51/5237* (2013.01); *H01L 51/5246* (2013.01); *H01L 51/5253* (2013.01); *H01L 2924/0002* (2013.01)

(56) References Cited

U.S. PATENT DOCUMENTS

| | | |
|---|---|---|
| 2011/0140113 A1 | 6/2011 | Park |
| 2012/0132953 A1 | 5/2012 | Becker et al. |
| 2012/0208306 A1* | 8/2012 | Haas ................... H01L 51/0014 438/26 |
| 2012/0256170 A1 | 10/2012 | Philippens et al. |

FOREIGN PATENT DOCUMENTS

| | | |
|---|---|---|
| DE | 102009003970 A1 | 7/2010 |
| EP | 1238306 A1 | 9/2002 |
| KR | 1020110078628 A | 7/2011 |
| KR | 1020120052378 A | 5/2012 |
| WO | 2011083414 A1 | 7/2011 |
| WO | 2012096008 A1 | 7/2012 |

OTHER PUBLICATIONS

German Search Report based on application No. 10 2012 214 325.4 (5 pages) dated Jun. 19, 2013.

Chinese Office Action (including Chinese Search Report) based on application No. 201380042536.3 (8 pages and 5 pages of English translation) dated Jul. 20, 2016.

Chinese Search Report based on application No. 2013800425363 (2 pages) dated Mar. 13, 2017.

Korean Notice of Allowance based on application No. 10-2015-7006232 (2 pages + 1 page English translation) dated Mar. 29, 2017.

* cited by examiner

METHOD FOR PRODUCING AN OPTOELECTRONIC COMPONENT AND METHOD FOR PATTERNING AN ORGANIC, OPTOELECTRONIC COMPONENT

RELATED APPLICATIONS

The present application is a national stage entry according to 35 U.S.C. §371 of PCT application No.: PCT/EP2013/066576 filed on Aug. 7, 2013, which claims priority from German application No.: 10 2012 214 325.4 filed on Aug. 10, 2012, and is incorporated herein by reference in its entirety.

TECHNICAL FIELD

In various embodiments, a method for producing an optoelectronic component and a method for patterning an organic optoelectronic component are provided.

BACKGROUND

Optoelectronic components, for example an organic light-emitting diode (OLED), may include a multiplicity of electrical and electronic parts, for example an organically functional layer structure with emitter layers, charge carrier transport layers, electrodes, contact pads and the like.

An electrical power supply of an OLED may be formed by an electrical connection of the contact pad of an OLED to terminals of an electrical power supply.

In order to protect against harmful substances, the optoelectronic components are often encapsulated with a thin film, the contact pads also being encapsulated with a thin film.

The encapsulation is conventionally carried out without a mask. In other words: the entire surface of the optoelectronic component is encapsulated.

The encapsulation may often include a plurality of encapsulating layers, for example SiN, $ZrO_2$, $Al_2O_3$ or the like.

The formation of the thin-film encapsulation on an optoelectronic component is often carried out by chemical vapor deposition.

In one conventional method, the contact pads for the electrical connection are exposed by removing the thin-film encapsulation from the contact pads by mechanical erosion of the thin-film encapsulation or laser ablation of the thin-film encapsulation.

In the case of erosion or laser ablation of the thin-film encapsulation from the contact pads, however, the contact pads may be partially damaged and/or the thin-film encapsulation may be removed only incompletely from the contact pads.

The degree of damage to the contact pads and/or the amount of thin-film encapsulation remaining on the contact pads may depend on the quality of the thin-film encapsulation.

The damaged contact pads or contact pads with thin-film encapsulation remaining may impair the functionality of an OLED, and for example lead to a change in the contact voltage and/or a change in the current/voltage characteristic.

In another conventional method, the thin-film encapsulation may be chemically deposited from the vapor phase onto the optoelectronic component in such a way that it is patterned by a masking process. During the masking process, however, particle contamination of the thin-film encapsulation and/or scratching of the thin-film encapsulation may occur. In this way, the protection of the organic light-emitting diode against harmful substances may be impaired, so that the lifetime of the optoelectronic component may be reduced.

In another conventional method, the thin-film encapsulation may be formed by atomic layer deposition (ALD) of the substance of the thin-film encapsulation on the organic light-emitting diode.

By ALD, for example, thin layers, for example multilayer structures, may in this case be formed. An electrical connection to the contact pads may be formed by contacting through the thin-film encapsulation. Contacting through the thin-film encapsulation may, however, lead to impairment of the electrical properties and/or optoelectronic properties of the optoelectronic component.

SUMMARY

In various embodiments, a method for producing an optoelectronic component and a method for patterning an organic optoelectronic component are provided, with which it is possible to increase the reproducibility of optoelectronic properties.

In the scope of this description, an organic substance may be understood as a compound of carbon existing in chemically uniform form and distinguished by characteristic physical and chemical properties, regardless of the respective aggregate state. Furthermore, in the scope of this description, an inorganic substance may be understood as a compound without carbon, or a simple carbon compound, existing in chemically uniform form and distinguished by characteristic physical and chemical properties, regardless of the respective aggregate state. In the scope of this description, an organic-inorganic substance (hybrid substance) may be understood as a compound including compound parts which contain carbon and compound parts which are free of carbon, existing in chemically uniform form and distinguished by characteristic physical and chemical properties, regardless of the respective aggregate state. In the scope of this description, the term "substance" includes all substances mentioned above, for example an organic substance, an inorganic substance and/or a hybrid substance. Furthermore, in the scope of this description, a substance mixture may be understood as something that consists of constituents of two or more different substances, the constituents of which are for example very finely distributed. A substance class is to be understood as a substance or a substance mixture consisting of one or more organic substances, one or more inorganic substances or one or more hybrid substances. The term "material" may be used synonymously with the term "substance".

In the scope of this description, a substrate may be understood as a partially fabricated organic optoelectronic component.

In various embodiments, a method for producing an organic optoelectronic component is provided. The method may include: forming a first layer on or over a substrate, the substrate including at least one contact pad of the organic optoelectronic component, at least one electrode of the organic optoelectronic component being electrically connected to the at least one contact pad; forming a second layer on or over the substrate; removing at least the second layer in at least one region of the substrate with the first layer on or over the at least one contact pad.

In one configuration, the first layer may be configured in relation to the thickness of the second layer with a thickness in a range of from approximately 10% (expressed another way, thickness of the first layer/thickness of the second layer=0.1) to approximately 400% (expressed another way, thickness of the first layer/thickness of the second layer=4).

In another configuration, the adhesion of the substance or substance mixture of the first layer with the substrate may be less than the adhesion of the substance or substance mixture of the second layer with the substrate.

In another configuration, the lower adhesion of the first layer with the substrate may be formed by a process.

In one configuration, the process may include at least one process step from the group of process steps: separating regions of the first layer and/or the second layer; ballistic bombardment of the first layer and/or second layer with electrons, ions, photons or the like; and/or a chemical process, for example a wet chemical process, a dry chemical process, for example chemical-mechanical polishing, etching or the like.

In the scope of this description, separating regions of a layer may be understood as forming at least two regions with the same or a similar substance composition from a layer by ballistic bombardment or chemical methods. The separated regions may have at least one physical contact less after the separation, for example no longer being physically connected to one another.

Ballistic bombardment with photons may, for example, be irradiation with electromagnetic radiation, for example UV radiation, infrared radiation or microwaves.

The UV radiation may lead to breaking of organic bonds, so that the respective layer can be removed more easily.

In the case of infrared irradiation, the substance or the substance mixture of the first layer may have at least one different infrared band to the substance or the substance mixture of the second layer. The absorbed infrared radiation may in this case be converted into phonons, i.e. it may lead to heating of the respective layer. The heated layer may, for example, have a temperature-dependent solubility product and/or a temperature-dependent surface tension; and/or it may be thermally unstable. In this way, the radiation-absorbing layer may, for example, be removed from the nonabsorbing layer, for example wet-chemically washed away.

In another configuration, the lower adhesion of the first layer may be formed after the removal of the second layer.

In another configuration, the lower adhesion of the first layer may be formed before the removal of the second layer.

In another configuration, the second layer may be removed in the at least one region by removing the first layer in the at least one region, i.e. the second layer may be removed together with the first layer, in which case the physical contact of the first layer with the second layer may be configured to be resistant.

In another configuration, the removal of the second layer with the first layer in the at least one region may take place after a modification of the first layer in the at least one region, in which case the modification of the first layer in the at least one region may include irradiation of the first layer with electromagnetic radiation in the at least one region.

In another configuration, the first layer may be resistant during the removal of the second layer, i.e. it is not affected by the process of removing the second layer.

In another configuration, a part of the first layer may be removed during the removal of the second layer.

The part of the first layer should, however, remain in the at least one region on the substrate and form a continuous surface. The physical contact of the first layer with the substrate may be configured to be resistant during the removal of the second layer.

If the first layer is removed more easily or more rapidly than the second layer with the process of removing the second layer, the thickness of the first layer should be correspondingly larger in order to ensure resistance of the physical contact of the first layer with the substrate.

The thickness of the first layer may be dependent on the sensitivity of the first layer in relation to the process for removing the second layer, the thickness of the second layer and the kinetics with which the second layer is removed, for example eroded.

In another configuration, the removal of the second layer includes at least one process from the group of processes: ballistic removal; mechanical removal; and/or chemical removal.

Ballistic removal may, for example, be carried out by bombardment of the region to be removed with particles, molecules, atoms, ions, electrons and/or photons.

Bombardment with photons may, for example, be carried out as laser irradiation with a wavelength in a range of from approximately 200 nm to approximately 1700 nm, for example focused, for example with a focal diameter in a range of from approximately 10 µm to approximately 2000 µm, for example pulsed, for example with a pulse duration in a range of from approximately 100 fs to approximately 0.5 ms, for example with a power of from approximately 50 mW to approximately 1000 mW, for example with a power density of from approximately 100 kW/cm$^2$ to approximately 10 GW/cm$^2$, and for example with a repetition rate in a range of from approximately 100 Hz to approximately 1000 Hz.

Ballistic removal with photons may for example be laser ablation, for example with a laser having a wavelength of approximately 248 nm, with a focal diameter of approximately 400 µm, with a pulse duration of approximately 15 ns and an energy of approximately 18 mJ.

Mechanical removal may for example include scratching, shaving, abrasion or wiping.

Chemical removal may for example include wet chemical etching or washing.

The removal of the second layer may however also include combinations of individual processes, for example chemical-mechanical polishing.

In another configuration, the second layer may be configured as an encapsulation layer of the optoelectronic component.

In another configuration, the second layer may be configured as an organically functional layer structure of the optoelectronic component.

In another configuration, the first layer may be configured as an organic functional layer structure of the optoelectronic component.

In another configuration, the first layer may include as a substance or be formed from one or more substances from the group of substances: chromium, aluminum, polyimide, molybdenum, copper.

The first layer may, for example, be configured as a resist, in which case the resist may for example include or be formed from a polyimide (PI).

In another configuration, the substrate may include a carrier and at least one further layer over or on the carrier.

In another configuration, the at least one further layer may be configured as an electrode or organically functional layer structure.

In another configuration, the method may further include the formation of further layers of the optoelectronic component on or over the second layer.

In another configuration, the substance or the substance mixture of the first layer may be configured to be similar to or the same as the substance or substance mixture of the second layer, in which case the removal of the first layer includes a different process or different process parameters to the removal of the second layer.

In another configuration, the method may be configured for the undamaged exposure of at least one electrode of an optoelectronic component.

In various embodiments, a method for patterning an organic optoelectronic component is provided, the method including: forming a first layer on or over an organic functional layer structure of the organic optoelectronic component; forming a second layer on or over the first layer; removing at least the second layer in at least one region with the first layer on or over the organic functional layer structure.

In one configuration of the method, the first layer may be configured with a thickness in a range of from approximately 10% to approximately 400% in relation to the thickness of the second layer.

In one configuration of the method, the adhesion of the substance or of the substance mixture of the first layer with the organic functional layer structure may be less than the adhesion of the substance or of the substance mixture of the second layer with the organic functional layer structure.

In one configuration of the method, the lower adhesion of the first layer with the organic functional layer structure may be formed by a process.

In one configuration of the method, the process may include at least one process step from the group of process steps: separation of regions of the first layer and/or second layer; bombardment of the first layer and/or second layer with electrons, ions, photons or the like.

In one configuration of the method, the lower adhesion of the first layer may be formed after the removal of the second layer.

In one configuration of the method, the lower adhesion of the first layer may be formed before the removal of the second layer.

In one configuration of the method, the second layer may be removed in the at least one region by removing the first layer in the at least one region.

In one configuration of the method, the removing the second layer with the first layer may take place after a modification of the first layer in the at least one region, in which case the modification includes irradiation of the first layer in the at least one region with electromagnetic radiation.

In one configuration of the method, the first layer may be resistant during the removal of the second layer, or expressed another way it is still fully present after the removal of the second layer.

In one configuration of the method, a part of the first layer may be removed during the removal of the second layer.

In one configuration of the method, the removing the second layer includes at least one process from the group of processes: ballistic removal; mechanical removal; and/or chemical removal.

In one configuration of the method, the second layer may be configured as an encapsulation layer of the optoelectronic component.

In one configuration of the method, the second layer may be configured as a layer of the organic functional layer structure of the optoelectronic component.

In one configuration of the method, the first layer may be configured as a layer of the organic functional layer structure of the optoelectronic component.

In one configuration of the method, the first layer may include as a substance or be formed from one or more substances from the group of substances: chromium, aluminum, polyimide, copper, molybdenum.

In one configuration of the method, the substance or the substance mixture of the first layer may be configured to be similar to or the same as the substance or the substance mixture of the second layer, in which case the removal of the first layer includes a different process or different process parameters to the removal of the second layer.

In one configuration of the method, the method may be configured for lateral patterning of the surface of an optoelectronic component, for example of the light field of an organic light-emitting diode.

A laterally patterned layer of an organic light-emitting diode may lead to a modification of the coupling conditions of the electromagnetic radiation in the organic light emitting diode. In this way, by the laterally patterned regions, it is possible to provide electromagnetic radiation with a color valency that may differ from the color valency of the electromagnetic radiation in the unpatterned regions.

In one configuration, the first layer may be removed in at least one region on or over the substrate during the fabrication of the optoelectronic component.

The substrate may be electrically contacted in the at least one region of the removed first layer, for example in order to power the optoelectronic component during fabrication for test purposes, for example by the substrate being configured as a contact pad.

In other words: at least one contact pad may for example be exposed for electrical contacting of the optoelectronic component during fabrication for inline measurement of the optoelectronic properties.

In one configuration, a part of the first layer may be removed, for example separated, for the inline measurement, for example before the first layer is removed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference will be made to the appended drawings, which are part of this description and in which specific embodiments in which the disclosure may be implemented are shown for illustration. In this regard, direction terminology such as "up", "down", "forward", "backward", "front", "rear", etc. is used with reference to the orientation of the figure or figures being described. Since components of embodiments can be positioned in a number of different orientations, the direction terminology is used for illustration and is in no way restrictive. It is to be understood that other embodiments may be used and structural or logical modifications may be carried out, without departing from the protective scope of the present disclosure. It is to be understood that the features of the various embodiments described herein may be combined with one another, unless specifically indicated otherwise. The following detailed description is therefore not to be interpreted in a restrictive sense, and the protective scope of the present disclosure is defined by the appended claims.

In the scope of this description, terms such as "connected" or "coupled" are used to describe both direct and indirect connection, and direct or indirect coupling. In the figures, elements which are identical or similar are provided with identical references, insofar as this is expedient.

Figure 1:
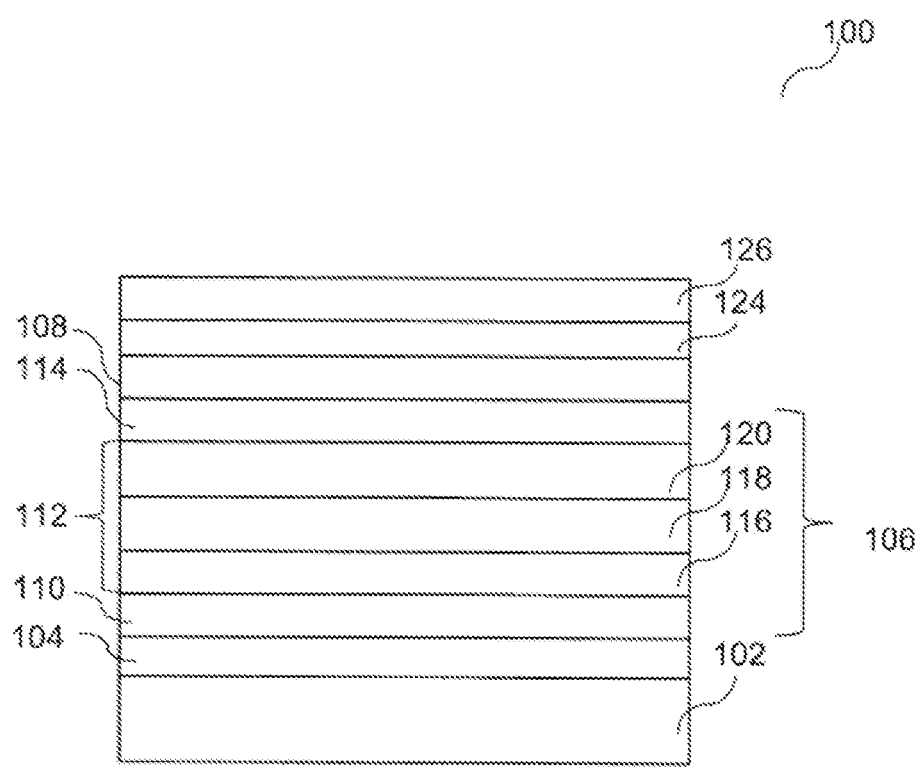
FIG. 1 shows a schematic cross-sectional view of an optoelectronic component according to various embodiments.

FIG. 1 shows a schematic cross-sectional view of an optoelectronic component according to various embodiments.

In the scope of this description, an optoelectronic component may be understood as a component which emits or absorbs electromagnetic radiation by a semiconductor component.

A component emitting electromagnetic radiation and/or a component absorbing electromagnetic radiation may in various embodiments be configured as a semiconductor component emitting and/or absorbing electromagnetic radiation and/or as a diode emitting and/or absorbing electromagnetic radiation, as an organic diode emitting electromagnetic radiation, as a transistor emitting electromagnetic radiation or as an organic transistor emitting electromagnetic radiation, as a photodiode absorbing electromagnetic radiation or a solar cell absorbing electromagnetic radiation.

The electromagnetic radiation may, for example, be light in the visible range, UV light and/or infrared light.

In the scope of this description, emission of electromagnetic radiation may be understood as provision of electromagnetic radiation.

In the scope of this description, absorption of electromagnetic radiation may be understood as reception of electromagnetic radiation.

For illustration, without restriction of generality, an optoelectronic component will be described below as an optoelectronic component providing electromagnetic radiation.

In another configuration, an optoelectronic component may be configured as an optoelectronic component receiving electromagnetic radiation, with the same or a similar structure.

The radiation-providing component 100 in the form of an organic light-emitting diode 100 may include a carrier 102. The carrier 102 may for example be used as a carrier element for electronic elements or layers, for example radiation-providing elements. For example, the carrier 102 may include or be formed from glass, quartz, and/or a semiconductor material or any other suitable substance. Furthermore, the carrier 102 may include or be formed from a plastic film or a laminate including one or more plastic films. The plastic may include or be formed from one or more polyolefins (for example polyethylene (PE) with high or low density or polypropylene (PP)). The plastic may furthermore include or be formed from polyvinyl chloride (PVC), polystyrene (PS), polyester and/or polycarbonate (PC), polyethylene terephthalate (PET), polyethersulfone (PES) and/or polyethylene naphthalate (PEN). The carrier 102 may include one or more of the materials mentioned above.

In one configuration, the carrier 102 may include or be formed from a metal or a metal compound, for example steel, aluminum, copper, silver, gold, platinum or the like.

In one configuration, a carrier 102 including a metal or a metal compound may also be configured as a metal foil or a metal-coated film.

In one configuration, the carrier 102 may include or be formed from glass or a glass composite, for example SF, LASF, LAF, BASF, BAF, LLF, LF, F, LAK, SSK, SK, PSK, BAK, BALF, PK, BK, K, KF, FK.

In one configuration, a carrier 102 including a glass or a glass composite may also be configured as a glass sheet or a glass-coated sheet.

The carrier 102 may be configured to be translucent or even transparent.

In various embodiments, the term "translucent" or "translucent layer" may be understood as meaning that a layer is transmissive for light, for example for the light generated by the radiation-emitting component, for example of one or more wavelength ranges, for example for light in a wavelength range of visible light (for example at least in a subrange of the wavelength range of from 380 nm to 780 nm). For example, in various embodiments, the term "translucent layer" is to be understood as meaning that essentially the total amount of light input into a structure (for example a layer) is also output from the structure (for example layer), in which case a part of the light may be scattered here, for example by a scattering layer. The scattering layer may for example include scattering centers, for example particles, configured in order to deviate electromagnetic radiation incident on the particles.

In various embodiments, the term "transparent" or "transparent layer" may be understood as meaning that a layer is transmissive for light (for example at least in a subrange of the wavelength range of from 380 nm to 780 nm), light input into a structure (for example a layer) also being output from the structure (for example layer) essentially without scattering. In various embodiments, "transparent" is therefore to be regarded as a special case of "translucent".

For the case in which, for example, a radiation-providing electronic component which is monochromatic or limited in its emission spectrum is intended to be provided, it is sufficient for the optically translucent layer structure to be translucent at least in a subrange of the wavelength range of the desired monochromatic light, or for the limited emission spectrum.

In various embodiments, the organic light emitting diode 100 (or the radiation-providing components according to the embodiments described above or below) may be configured as a so-called top and bottom emitter. A top and/or bottom emitter may also be referred to as an optically transparent component, for example a transparent organic light-emitting diode.

In various embodiments, a barrier layer 104 may optionally be arranged on or over the carrier 102. The barrier layer 104 may include or consist of one or more of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. Furthermore, in various embodiments, the barrier layer 104 may have a layer thickness in a range of from approximately 0.1 nm (one atomic layer) to approximately 5000 nm, for example a layer thickness in a range of from approximately 10 nm to approximately 200 nm, for example a layer thickness of approximately 40 nm.

An electrically active region 106 of the radiation-providing component 100 may be arranged on or over the barrier layer 104. The electrically active region 106 may be understood as the region of the radiation-providing component 100 in that an electric current for operation of the radiation-providing component 100 flows. In various embodiments, the electrically active region 106 may include a first electrode 110, a second electrode 114 and an organic functional layer structure 112, as will be explained in more detail below.

Thus, in various embodiments, the first electrode 110 (for example in the form of a first electrode layer 110) may be applied on or over the barrier layer 104 (or, if the barrier layer 104 is absent, on or over the carrier 102). The first electrode 110 (also referred to below as lower electrode 110) may be formed from an electrically conductive material, for example a metal or a transparent conductive oxide (TCO), or a layer stack of a plurality of layers of the same metal or different metals and/or of the same TCO or different TCOs. Transparent conductive oxides are transparent conductive materials, for example metal oxides, for example zinc oxide, tin oxide, cadmium oxide, titanium oxide, indium oxide or indium tin oxide (ITO). Besides binary metal-oxygen compounds, for example ZnO, $SnO_2$, or $In_2O_3$, ternary metal-oxygen compounds, for example AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of various transparent conductive oxides also belong to the TCO group and may be used in various embodiments. Furthermore, the TCOs do not necessarily correspond to a stoichiometric composition, and may furthermore be p-doped or n-doped.

In various embodiments, the first electrode 110 may include a metal; for example Ag, Pt, Au, Mg, Al, Ba, In, Ag, Au, Mg, Ca, Sm or Li, as well as compounds, combinations or alloys of these materials.

In various embodiments, the first electrode 110 may be formed from a layer stack of a combination of a layer of a metal on a layer of a TCO, or vice versa. One example is a silver layer, which is applied on an indium tin oxide layer (ITO) (Ag on ITO) or ITO/Ag/ITO multilayers.

In various embodiments, the first electrode 110 may include one or more of the following materials as an alternative or in addition to the materials mentioned above: networks of metal nanowires and nanoparticles, for example of Ag; networks of carbon nanotubes; graphene particles and graphene layers; networks of semiconducting nanowires.

Furthermore, the first electrode 110 may include electrically conductive polymers or transition metal oxides or electrically conductive transparent oxides.

In various embodiments, the first electrode 110 and the carrier 102 may be configured to be translucent or transparent. In the case in which the first electrode 110 includes or is formed from a metal, the first electrode 110 may for example have a layer thickness less than or equal to approximately 25 nm, for example a layer thickness less than or equal to approximately 20 nm, for example a layer thickness less than or equal to approximately 18 nm. Furthermore, the first electrode 110 may for example have a layer thickness greater than or equal to approximately 10 nm, for example a layer thickness greater than or equal to approximately 15 nm. In various embodiments, the first electrode 110 may have a layer thickness in a range of from approximately 10 nm to approximately 25 nm, for example a layer thickness in a range of from approximately 10 nm to approximately 18 nm, for example a layer thickness in a range of from approximately 15 nm to approximately 18 nm.

Furthermore, for the case in which the first electrode 110 includes or is formed from a conductive transparent oxide (TCO), the first electrode 110 may for example have a layer thickness in a range of from approximately 50 nm to approximately 500 nm, for example a layer thickness in a range of from approximately 75 nm to approximately 250 nm, for example a layer thickness in a range of from approximately 100 nm to approximately 150 nm.

Furthermore, for the case in which the first electrode 110 is formed for example from a network of metal nanowires, for example of Ag, which may be combined with conductive polymers, a network of carbon nanotubes, which may be combined with conductive polymers, or of graphene layers and composites, the first electrode 110 may for example have a layer thickness in a range of from approximately 1 nm to approximately 500 nm, for example a layer thickness in a range of from approximately 10 nm to approximately 400 nm, for example a layer thickness in a range of from approximately 40 nm to approximately 250 nm.

The first electrode 110 may be configured as an anode, i.e. as a hole-injecting electrode, or as a cathode, i.e. as an electron-injecting electrode.

The first electrode 110 may include a first electrical contact pad, to which a first electrical potential (provided by an energy source (not represented), for example a current source or a voltage source) can be applied. As an alternative, the first electrical potential may be applied to the carrier 102 and then delivered indirectly via the latter to the first electrode 110. The first electrical potential may, for example, be the ground potential or another predetermined reference potential.

Furthermore, the electrically active region 106 of the radiation-providing component 100 may include an organic functional layer structure 112, which is applied or configured on or over the first electrode 110.

The organic functional layer structure 112 may include one or more emitter layers 118, for example including fluorescent and/or phosphorescent emitters, as well as one or more hole conduction layers 116 (also referred to as hole transport layer or layers 120). In various embodiments, as an alternative or in addition, one or more electron conduction layers 116 (also referred to as electron transport layer or layers 116) may be provided.

In the scope of this description, a hole transport layer may also be configured and/or understood as an electron blocking layer.

In the scope of this description, an electron transport layer may also be configured and/or understood as a hole blocking layer.

Examples of emitter materials which may be used in the radiation-providing component 100 according to various embodiments for the emitter layer or layers 118 include organic or organometallic compounds, for example derivatives of polyfluorene, polythiophene and polyphenylene (for example 2- or 2,5-substituted poly-p-phenylene vinylene) and metal complexes, for example iridium complexes, for example blue phosphorescent FIrPic (bis(3,5-difluoro-2-(2-pyridyl)phenyl-(2-carboxypyridyl)-iridium III), green phosphorescent Ir(ppy)$_3$ (tris(2-phenylpyridine)iridium III), red phosphorescent Ru(dtb-bpy)$_3$*2(PF$_6$) (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 (4-dicyanomethylene)-2-methyl-6-julolidyl-9-enyl-4H-pyrane) as nonpolymeric emitters. Such nonpolymeric emitters may, for example, be deposited by thermal evaporation. Furthermore, polymeric emitters may be used, which may in particular be deposited by a wet chemical method, for example a spin coating method, a printing method, for example screen printing, doctor blading, a pad printing method, jetting, dip coating or the like.

The emitter materials may be embedded in a suitable way in a matrix material.

It should be pointed out that other suitable emitter materials are likewise provided in other embodiments.

The emitter materials of the emitter layer or layers 118 of the radiation-providing component 100 may, for example, be selected in such a way that the radiation-providing component 100 emits white light. The emitter layer or layers 118 may include a plurality of emitter materials emitting different colors (for example blue and yellow or blue, green and red); as an alternative, the emitter layer or layers 118 may also be constructed from a plurality of sublayers, for example a blue fluorescent emitter layer 118 or blue phosphorescent emitter layer 118, a green phosphorescent emitter layer 118 and a red phosphorescent emitter layer 118. Mixing of the different colors can lead to the emission of light with a white color impression. As an alternative, a converter material may also be arranged in the beam path of the primary emission generated by these layers, which material at least partially absorbs the primary radiation and emits secondary radiation with a different wavelength, so that a white color impression is obtained from (not yet white) primary radiation by the combination of primary and secondary radiation.

The organic functional layer structure 112 may in general include one or more electroluminescent layers. The one or more electroluminescent layers may include organic polymers, organic oligomers, organic monomers, nonpolymeric organic small molecules, or a combination of these materials. For example, the organic functional layer structure 112 may include one or more electroluminescent layers which is or are configured as a hole transport layer 120, so that, for example in the case of an OLED, effective hole injection into an electroluminescent layer or an electroluminescent region is made possible. As an alternative, in various embodiments, the organic functional layer structure 112 may include one or more functional layers which is or are configured as an electron transport layer 116, so that, for example in the case of an OLED, effective electron injection into an electroluminescent layer or an electroluminescent region is made possible. For example, tertiary amines, carbazole derivatives, conductive polyaniline or polyethylene dioxythiophene may be used as a material for the hole transport layer 120. In various embodiments, the one or more electroluminescent layers may be configured as an electroluminescent layer.

In various embodiments, the hole transport layer 120 may be applied, for example deposited, on or over the first electrode 110, and the emitter layer 118 may be applied, for example deposited, on or over the hole transport layer 120. In various embodiments, the electron transport layer 116 may be applied, for example deposited, on or over the emitter layer 118.

In various embodiments, the organic functional layer structure 112 (i.e. for example the sum of the thicknesses of hole transport layer or layers 120 and emitter layer or layers 118 and electron transport layer or layers 116) may have a layer thickness of at most approximately 1.5 µm, for example a layer thickness of at most approximately 1.2 µm, for example a layer thickness of at most approximately 1 µm, for example a layer thickness of at most approximately 800 nm, for example a layer thickness of at most approximately 500 nm, for example a layer thickness of at most approximately 400 nm, for example a layer thickness of at most approximately 300 nm. In various embodiments, the organic functional layer structure 112 may for example include a stack of a plurality of organic light-emitting diodes (OLEDs) that are arranged directly above one another, in which case each OLED may for example have a layer thickness of at most approximately 1.5 µm, for example a layer thickness of at most approximately 1.2 µm, for example a layer thickness of at most approximately 1 µm, for example a layer thickness of at most approximately 800 nm, for example a layer thickness of at most approximately 500 nm, for example a layer thickness of at most approximately 400 nm, for example a layer thickness of at most approximately 300 nm. In various embodiments, the organic functional layer structure 112 may for example include a stack of two, three or four OLEDs that are arranged directly above one another, in which case, for example, the organic functional layer structure 112 may have a layer thickness of at most approximately 3 µm.

The radiation-providing component 100 may in general optionally include further organic functional layers, for example arranged on or over the one or more emitter layers 118 or on or over the electron transport layer or layers 116, which are used to further improve the functionality and therefore the efficiency of the radiation-providing component 100.

The second electrode 114 may be applied (for example in the form of a second electrode layer 114) on or over the organic functional layer structure 112, or optionally on or over the one or more further organic functional layers.

In various embodiments, the second electrode 114 may include or be formed from the same substances as the first electrode 110, metals being particularly suitable in various embodiments.

In various embodiments, the second electrode 114 (for example for the case of a metallic second electrode 114) may for example have a layer thickness less than or equal to approximately 50 nm, for example a layer thickness less than or equal to approximately 45 nm, for example a layer thickness less than or equal to approximately 40 nm, for example a layer thickness less than or equal to approximately 35 nm, for example a layer thickness less than or equal to approximately 30 nm, for example a layer thickness less than or equal to approximately 25 nm, for example a layer thickness less than or equal to approximately 20 nm, for example a layer thickness less than or equal to approximately 15 nm, for example a layer thickness less than or equal to approximately 10 nm.

The second electrode 114 may in general be configured in a similar way to the first electrode 110, or differently thereto. The second electrode 114 may, in various embodiments, be formed from one or more of the materials and with the respective layer thickness as described above in connection with the first electrode 110. In various embodiments, the first electrode 110 and the second electrode 114 are both configured to be translucent or transparent. The radiation-providing component 100 represented in FIG. 1 may therefore be configured as a top and bottom emitter (expressed in another way, as a transparent radiation-providing component 100).

The second electrode 114 may be configured as an anode, i.e. as a hole-injecting electrode, or as a cathode, i.e. as an electron-injecting electrode.

The second electrode 114 may include a second electrical terminal, to which a second electrical potential (which is different to the first electrical potential) provided by the energy source can be applied. The second electrical potential may, for example, have a value such that the difference from the first electrical potential has a value in a range of from approximately 1.5 V to approximately 20 V, for example a value in a range of from approximately 2.5 V to approximately 15 V, for example a value in a range of from approximately 3 V to approximately 12 V.

Encapsulation 108, for example in the form of a barrier thin film/thin-film encapsulation 108, may optionally also be formed on or over the second electrode 114, and therefore on or over the electrically active region 106.

In the scope of this application, a "barrier thin film" 108 may, for example, be understood as a layer or a layer structure which is suitable for forming a barrier against chemical contaminants or atmospheric substances, in particular against water (moisture) and oxygen. In other words, the barrier thin film 108 is configured in such a way that it cannot be penetrated, or can be penetrated at most in very small amounts, by substances that damage OLEDs, such as water, oxygen or solvents.

According to one configuration, the barrier thin film 108 may be configured as an individual layer (expressed another way, as a single layer). According to an alternative configuration, the barrier thin film 108 may include a multiplicity of sublayers formed on top of one another. In other words, according to one configuration, the barrier thin film 108 may be configured as a layer stack. The barrier thin film 108, or one or more sublayers of the barrier thin film 108, may for example be formed by a suitable deposition method, for example by an atomic layer deposition (ALD) method according to one configuration, for example a plasma-enhanced atomic layer deposition (PEALD) method or a plasma-less atomic layer deposition (PLALD) method, or by a chemical vapor deposition (CVD) method according to another configuration, for example a plasma-enhanced chemical vapor deposition (PECVD) method or a plasma-less chemical vapor deposition (PLCVD) method, a low temperature deposition method, or alternatively by other suitable deposition methods.

By using an atomic layer deposition (ALD) method, very thin layers can be deposited. In particular, layers whose layer thicknesses lie in the atomic layer range can be deposited.

According to one configuration, in the case of a barrier thin film 108 which includes a plurality of sublayers, all the sublayers may be formed by an atomic layer deposition method. A layer sequence which only includes ALD layers may also be referred to as a "nanolaminate".

According to an alternative configuration, in the case of a barrier thin film 108 which includes a plurality of sublayers, one or more sublayers of the barrier thin film 108 may be deposited by a deposition method other than an atomic layer deposition method, for example by a vapor deposition method.

The barrier thin film 108 may, according to one configuration, have a layer thickness of from approximately 0.1 nm (one atomic layer) to approximately 10000 nm, for example a layer thickness of from approximately 1 nm to approximately 1000 nm according to one configuration, for example a layer thickness of from approximately 10 nm to approximately 100 nm according to one configuration, for example approximately 40 nm according to one configuration.

According to one configuration, in which the barrier thin film 108 includes a plurality of sublayers, all the sublayers may have the same layer thickness. According to another configuration, the individual sublayers of the barrier thin film 108 may have different layer thicknesses. In other words, at least one of the sublayers may have a different layer thickness than one or more others of the sublayers.

The barrier thin film 108, or the individual sublayers of the barrier thin film 108, may according to one configuration be configured as a translucent or transparent layer. In other words, the barrier thin film 108 (or the individual sublayers of the barrier thin film 108) may consist of a translucent or transparent substance (or a substance mixture which is translucent or transparent).

According to one configuration, the barrier thin film 108, or (in the case of a layer stack including a multiplicity of sublayers) one or more of the sublayers of the barrier thin film 108, may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin film 108, or (in the case of a layer stack including a multiplicity of sublayers) one or more of the sublayers of the barrier thin film 108, may include one or more high-index materials, or expressed another way one or more materials having a high refractive index, for example having a refractive index of at least 2.

In various embodiments, an adhesive and/or a protective coating 124 may be provided on or over the barrier thin film 108, by which, for example, a cover 126 (for example a glass cover 126) is fastened, for example adhesively bonded, on the barrier thin film 108. In various embodiments, the optically translucent layer of adhesive and/or protective coating 124 may have a layer thickness of more than 1 μm, for example a layer thickness of several μm. In various embodiments, the adhesive may include or be a lamination adhesive.

In various embodiments, light-scattering particles, which can lead to a further improvement of the hue distortion and of the output efficiency, may also be embedded in the layer of adhesive (also referred to as the adhesive layer). In various embodiments, dielectric scattering particles may be provided as light-scattering particles, for example metal oxides, for example silicon oxide ($SiO_2$), zinc oxide (ZnO), zirconium oxide ($ZrO_2$), indium tin oxide (ITO) or indium zinc oxide (IZO), gallium oxide ($Ga_2O_a$) aluminum oxide or titanium oxide. Other particles may also be suitable, so long as they have a refractive index which is different to the effective refractive index of the matrix of the translucent layer structure, for example air bubbles, acrylate, or hollow glass spheres. Furthermore, for example, metal nanoparticles, metals such as gold or silver, iron nanoparticles, or the like, may be provided as light-scattering particles.

In various embodiments, an electrically insulating layer (not represented) may also be applied between the second electrode 114 and the layer of adhesive and/or protective coating 124, for example a layer of SiN, $SiO_x$ for example with a layer thickness in a range of from approximately 300 nm to approximately 1.5 µm, for example with a layer thickness in a range of from approximately 500 nm to approximately 1 µm, in order to protect electrically unstable materials, for example during a wet chemical process.

In various embodiments, the adhesive may be configured so that it itself has a refractive index which is less than the refractive index of the cover 126. Such an adhesive may for example be a low-index adhesive, for example an acrylate, which has a refractive index of approximately 1.3. Furthermore, a plurality of different adhesives, which form an adhesive layer sequence, may be provided.

Furthermore, it should be pointed out that, in various embodiments, an adhesive 124 may even be entirely omitted, for example in embodiments in which the cover 126, for example consisting of glass, is applied for example by plasma spraying onto the barrier thin film 108.

In various embodiments, the cover 126 and/or the adhesive 124 may have a refractive index (for example at a wavelength of 633 nm) of 1.55.

In one configuration, the cover 126, for example made of glass, may be applied for example by frit bonding (glass frit bonding/glass soldering/seal glass bonding) by a conventional glass solder in the geometrical edge regions of the organic optoelectronic component 100 with the barrier thin film 108.

In one configuration, the cover 126, for example made of glass, for example by cavity encapsulation, for example by adhesive bonding of lamination films, the organic optoelectronic component 100 being encapsulated in the cavity and fixed in the cavity by the adhesive 124.

Furthermore, in various embodiments one or more anti-reflection layers (for example combined with the encapsulation 108, for example the thin-film encapsulation 108) may additionally be provided in the radiation-providing component 100.

Figure 2:
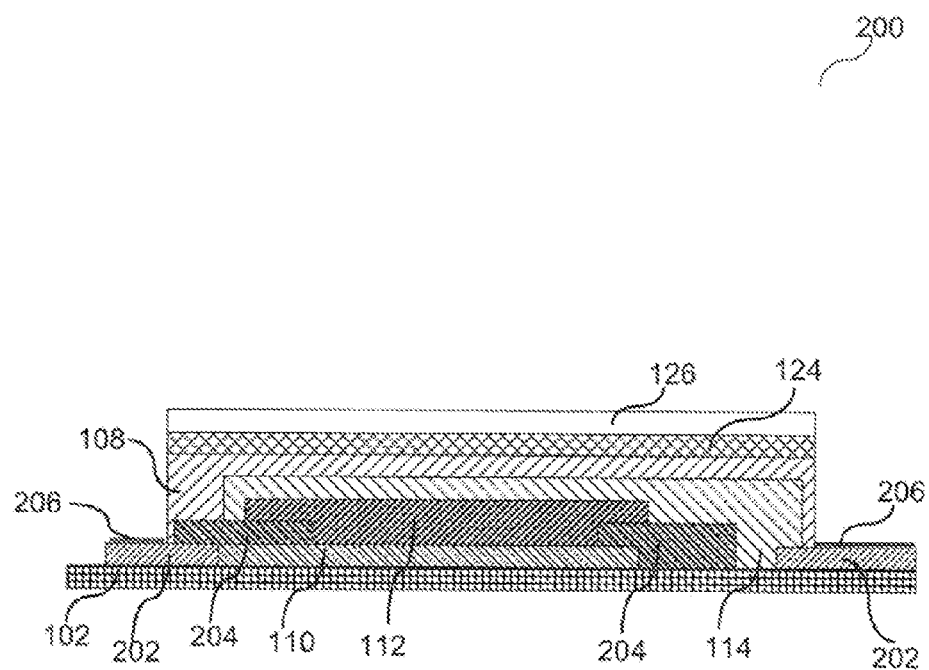
FIG. 2 shows a schematic cross-sectional view of an optoelectronic component according to various configurations.

FIG. 2 shows a schematic cross-sectional view of an optoelectronic component according to various embodiments.

A schematic layer cross section of an optoelectronic component 100 according to one of the configurations of the description of FIG. 1 is represented, FIG. 2 additionally representing, for example, a contacting structure for electrical contacting of the optoelectronic component 100.

The represented cross section of an optoelectronic component may be understood as a cross section 200 of an optoelectronic component 100 in the method for producing an optoelectronic component.

The first electrode 110 may, for example, include or be formed from ITO. The second electrode 114 may include or be formed from a metal, for example aluminum or copper.

The electrodes 110, 114 may be moved to the geometrical edge of the carrier 102 by contact pads 202.

The first electrode 110 may be electrically insulated from the second electrode 114 by a resist 204, for example a polyimide 204.

The first electrode 110 and the second electrode 114 may be formed in the same drawing plane (as represented) or in different drawing planes, for example being arranged in a similar way to the shape of a cross.

In the method for producing an optoelectronic component, the exposed regions 206 of the contact pads 202 may be undamaged, i.e. configured as a continuous region 206, and be free of layers on or over the exposed regions 206, for example parts of the encapsulation 108.

Figure 3:
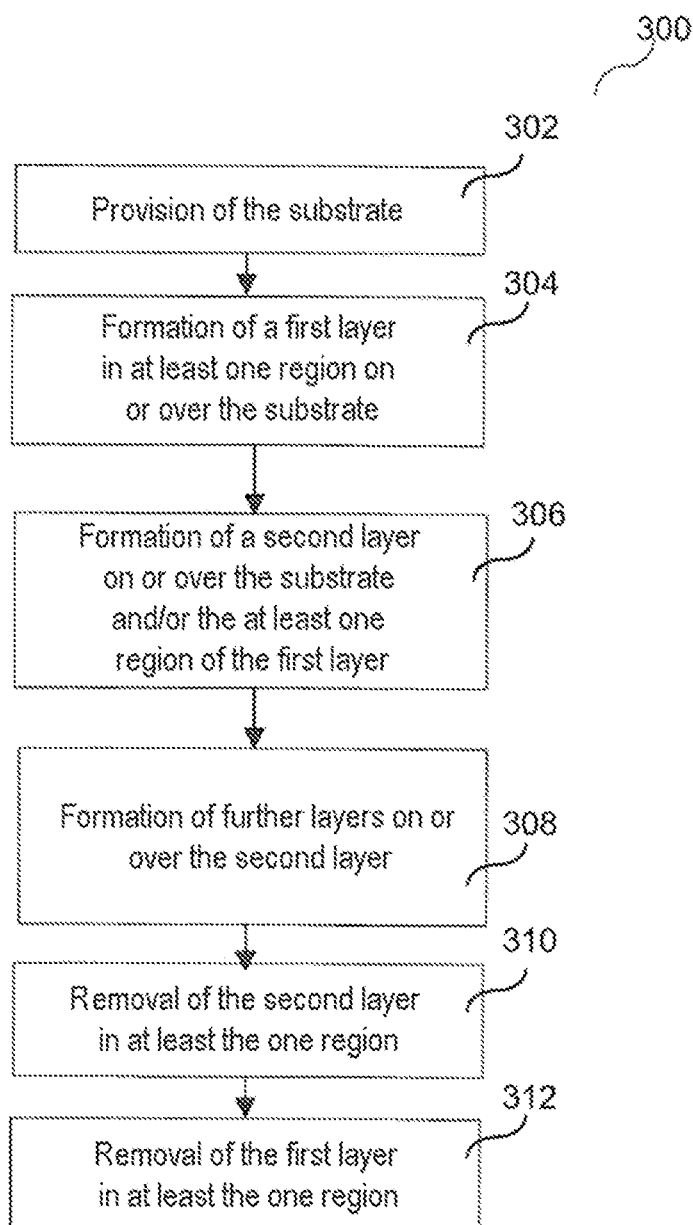
FIG. 3 shows a diagram of a method for production of an optoelectronic component, according to various configurations.

FIG. 3 shows a diagram of a method for producing an optoelectronic component according to various configurations.

FIG. 3 represents the conduct of a method for producing an optoelectronic component according to one of the configurations of the description of FIG. 1 and/or FIG. 2.

The method for producing an optoelectronic component may include formation 304 of a first layer of the optoelectronic component on or over a substrate of the optoelectronic component.

The formation 304 of the first layer may for example include a process from the group of processes: vapor deposition, lithography, printing, for example pad printing, an etching process and/or vapor deposition, for example chemical or physical vapor deposition of the substance or of the substance mixture of the first layer, sputtering or a similar conventional method.

Figure 8:
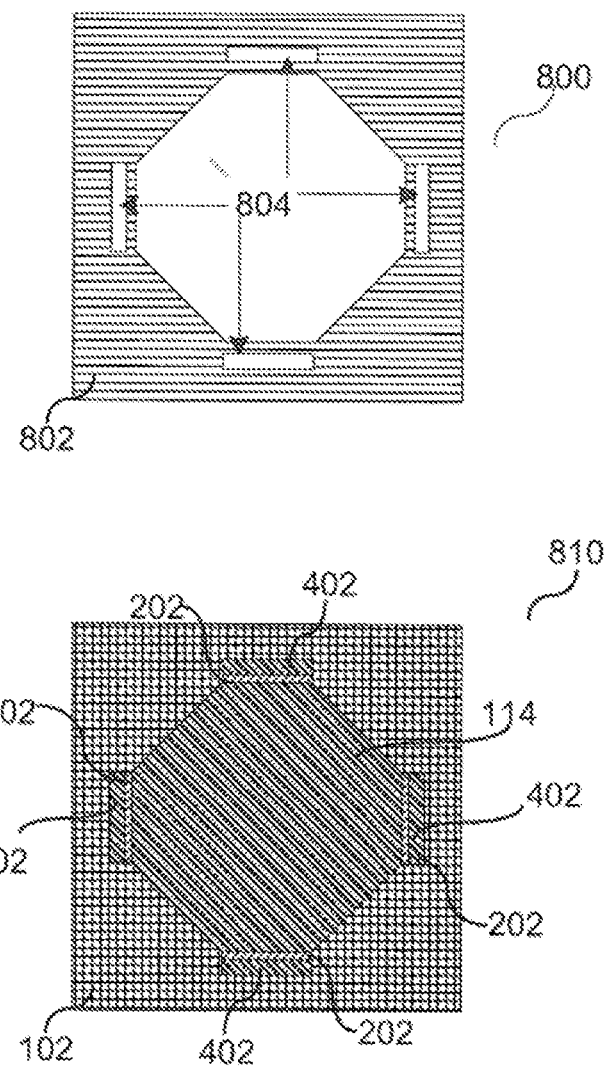
FIG. 8 shows schematic plan views of a mask and of an optoelectronic component in a method for producing an optoelectronic component, according to various configurations.

In one configuration, the formation 304 of the first layer may be configured at least partially in parallel with a process for forming the optoelectronic component 100 (see also the configurations of FIG. 8).

The substrate may in this case be understood at least as a carrier 102, in which case further layers may be formed on or over the carrier 102. In this case, the surface of further layers may form the substrate.

Further layers may for example be produced as a first electrode 110, organic functional layer structure 112, second electrode 114, contact pads 202 and resist 204. In other words: a carrier 102 including further layers 110, 112, 114, 202, 204 may for example be understood as a substrate for producing an optoelectronic component 100. The substrate may in this case include some of the further layers 110, 112, 114, 202, 204 as well as yet further layers 108, 124, 126.

The method may furthermore include formation 306 of a second layer of the optoelectronic component on or over the substrate of the optoelectronic component and/or of the first layer of the optoelectronic component. The second layer may in this case be formed at least in a region on or over the first layer of the optoelectronic component.

In one configuration, the adhesion of the first layer on the substrate may be reduced before or after the formation 306 of the second layer on the first layer.

The reduction of the adhesion of the first layer may, for example, include irradiation of the at least one region of the substrate with the first layer and the second layer with electromagnetic radiation.

Irradiation of a first layer of a crosslinked organic substance or substance mixture with high-energy electromagnetic radiation, for example UV radiation, may lead to degradation of the organic substance or of the organic substance mixture.

The degraded organic substance or the degraded organic substance mixture may, for example, have a higher chemical solubility than the undegraded organic substance or the undegraded organic substance mixture.

The degraded organic substance or the degraded organic substance mixture may then, later in the method, be removed, for example washed away, more easily than the undegraded organic substance or the undegraded organic substance mixture.

Furthermore, the method may include formation 308 of further layers 108, 124, 126. These further layers 108, 124, 126 may also be patterned.

The method may furthermore include removal at least of the second layer in at least one part of this region.

The surface of the substrate may be configured to be resistant in this region before, during and after the removal 310 of the second layer, i.e. the surface of the substrate may be invariant in the at least one region with the first layer and the second layer.

In one configuration, the properties of the surface of the substrate may be unaffected by the removal of the first layer and/or the removal of the second layer.

The removal 310 of the second layer may, for example, include as a process a process from the group of processes: ballistic removal, chemical and/or physical etching.

Ballistic removal may, for example, be carried out by bombardment of the region to be removed with particles, molecules, atoms, ions, electrons and/or photons.

Bombardment with photons may, for example, be carried out by a laser with a wavelength in a range of from approximately 200 nm to approximately 1700 nm, for example focused, for example with a focal diameter in a range of from approximately 10 µm to approximately 2000 µm, for example pulsed, for example with a pulse duration in a range of from approximately 100 fs to approximately 0.5 ms, for example with a power of from approximately 50 mW to approximately 1000 mW, for example with a power density of from approximately 100 kW/cm$^2$ to approximately 10 GW/cm$^2$, and for example with a repetition rate in a range of from approximately 100 Hz to approximately 1000 Hz. Ballistic removal with photons may for example be laser ablation, for example with a laser having a wavelength of approximately 248 nm, with a focal diameter of approximately 400 µm, with a pulse duration of approximately 15 ns and an energy of approximately 18 mJ.

After the removal 310 of the second layer, the method 300 may include removal 312 of the first layer from the substrate.

The removal 312 of the first layer may as a process include a process which is configured to be similar or different to the process of the removal of the second layer 310, for example by using similar or different parameters for the process, for example laser ablation of the first layer, but with a lower laser power than for laser ablation of the second layer over or on the first layer.

In one configuration, the removal 312 of the first layer may be configured simultaneously with or after the removal 310 of the second layer.

Simultaneous removal of the second layer with the first layer may for example include removal 312, for example detachment 312, of the first layer from the substrate in the at least one region, without the structure of the second layer thereby being modified. In other words: the first layer and the second layer may be removed in their entirety from the at least one region of the substrate.

In one configuration, the first layer may be configured to be resistant during the removal 310 of the second layer, i.e. the first layer is not removed during the removal 310 of the second layer, for example because the substance or the substance mixture of the first layer is not sensitive to the process of the removal 310 of the second layer.

In one configuration, the first layer may be configured to be partially resistant during the removal 310 of the second layer, i.e. the first layer is partially removed during the removal 310 of the second layer, i.e. a part of the first layer remains on the substrate, the remaining part of the first layer having a continuous surface.

The first layer may for example include a plurality of sublayers, for example of the organic functional layer system. The substances or the substance mixtures of some of these sublayers may, for example, be sensitive to the process of the removal 310 of the second layer. These sublayers may then be removed together with the second layer during the removal 310 of the second layer.

The first layer may however also include only one individual layer, parts of which are also removed during the removal 310 of the second layer.

The substance or the substance mixture of the first layer may be configured to be less sensitive to the process of the removal 310 of the second layer. In other words: the substance or the substance mixture of the first layer may have weaker kinetics in relation to the process of the removal of the second layer than the substance or the substance mixture of the second layer.

In another configuration, the substance or the substance mixture of the first layer may have more sensitive in relation to the process of the removal 310 of the second layer than the substance or the substance mixture of the second layer. In other words: the removal of the substance or of the substance mixture of the first layer may have stronger kinetics than the removal of the substance or of the substance mixture of the second layer in relation to the at least one process of the removal 310 of the second layer.

In the case, the first layer may, on the at least one region of the substrate, have a value of the layer thickness which is greater than the value of the layer thickness of the second layer. The specific value of the layer thickness of the first layer may be dependent on the specific configuration of the at least one process of the removal 310 of the second layer, as well as the physical and chemical properties of the substances and/or of the substance mixture of the first layer and/or of the second layer.

In another configuration, the removal 312 of the first layer may be optional in the method for producing an optoelectronic component, i.e. the first layer is not removed from the at least one region of the substrate.

In this configuration, contacting of the optoelectronic component with an external electrical power supply may be configured through the first layer by the at least one region of the substrate. In other words: contact may be made through the first layer, for example by the first layer being configured to be electrically conductive.

In another configuration, the contacting through the first layer may be configured mechanically, for example by the substance or the substance mixture of the first layer being physically configured in such a way that it is mechanically displaced by the terminals of the external electrical power supply during the formation of the electrical connection.

In one configuration, the contact pads 202 may be electrically connected to a flexible printed circuit board (flex PCB).

The exposed contact pads 202 can be connected more simply to a flexible printed circuit board than damaged contact pads 202 or contact pads 202 with encapsulation 108.

Figure 4:
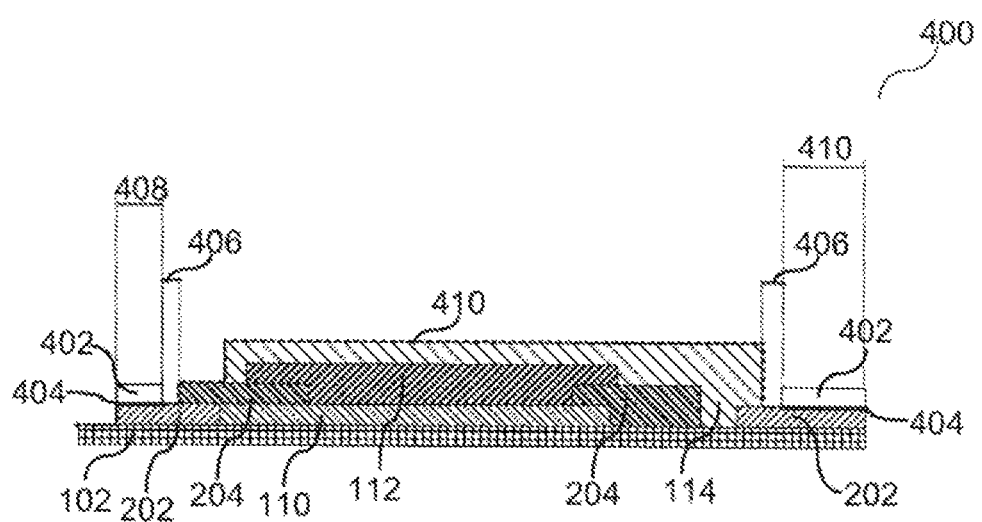
FIG. 4 shows a schematic cross section of an optoelectronic component in a method for producing an optoelectronic component, according to various configurations.

FIG. 4 shows a schematic cross section of an optoelectronic component in a method for producing an optoelectronic component, according to various configurations.

The substrate may for example be configured in a similar way or in the same way as one of the configurations of the description of FIG. 1 and/or FIG. 2, and may include: a carrier 102, a first electrode 110, an organic functional layer structure 112, a second electrode 114, at least one contact pad 202 and resist 204.

The dashed line 410 represented in the cross section 400 may be understood as the surface of the substrate 410, i.e. as the boundary of the carrier 102 and of the layers 110, 112, 114, 202, 204 on or over the carrier 102 in relation to a first layer 402 and a second layer (not represented).

A first layer 402 may be applied onto the substrate on at least one region 408 of the substrate, for example two regions (as represented). The substrate may include more or fewer layers on or over the carrier 102 in the at least one region 408 than in other regions of the substrate. For example, the optoelectronic component may include fewer layers on or over the carrier 102 at the geometrical edges of the carrier 102, for example the contact pads 202, than in the geometrical middle of the carrier 102, for example the first electrode 110, the organic functional layer structure 112 and the second electrode 114.

In one configuration, the first layer 402 may, for example, be formed over a contact pad 202. In other words, the first layer 402 may be in physical contact with a contact pad 202 and share a common interface 404.

The first layer 402 may include one or more layers, for example one or more layers of the organic functional layer system. The first layer 402 may, for example, include as a substance or be formed from a substance from the group of substances: aluminum, chromium, nickel, a resist, for example a polyimide, and/or a substance or substance mixture of the organically functional layer structure.

The first layer 402 may be configured to be patterned on the at least one region 408 of the substrate, for example by a spacing 406 being formed between the first layer 402 and laterally neighboring layers, for example the resist 204 or the second electrode 114.

In one configuration, the first layer 402 may be removed in at least one region on or over the contact pad 202 during the fabrication of the optoelectronic component, for example in the region of the spacing 406.

The contact pads 202 may be electrically contacted in the at least one region, for example in the region of the spacing 406, for example in order to power the optoelectronic component for test purposes during fabrication.

In other words: the contact pads 202 may, for example, be exposed for electrical contacting of the optoelectronic component during fabrication for inline measurement of the optoelectronic properties.

In one configuration, a part of the first layer 402 may be removed, for example separated, for the inline measurement, for example before the first layer 402 is removed.

Figure 5:
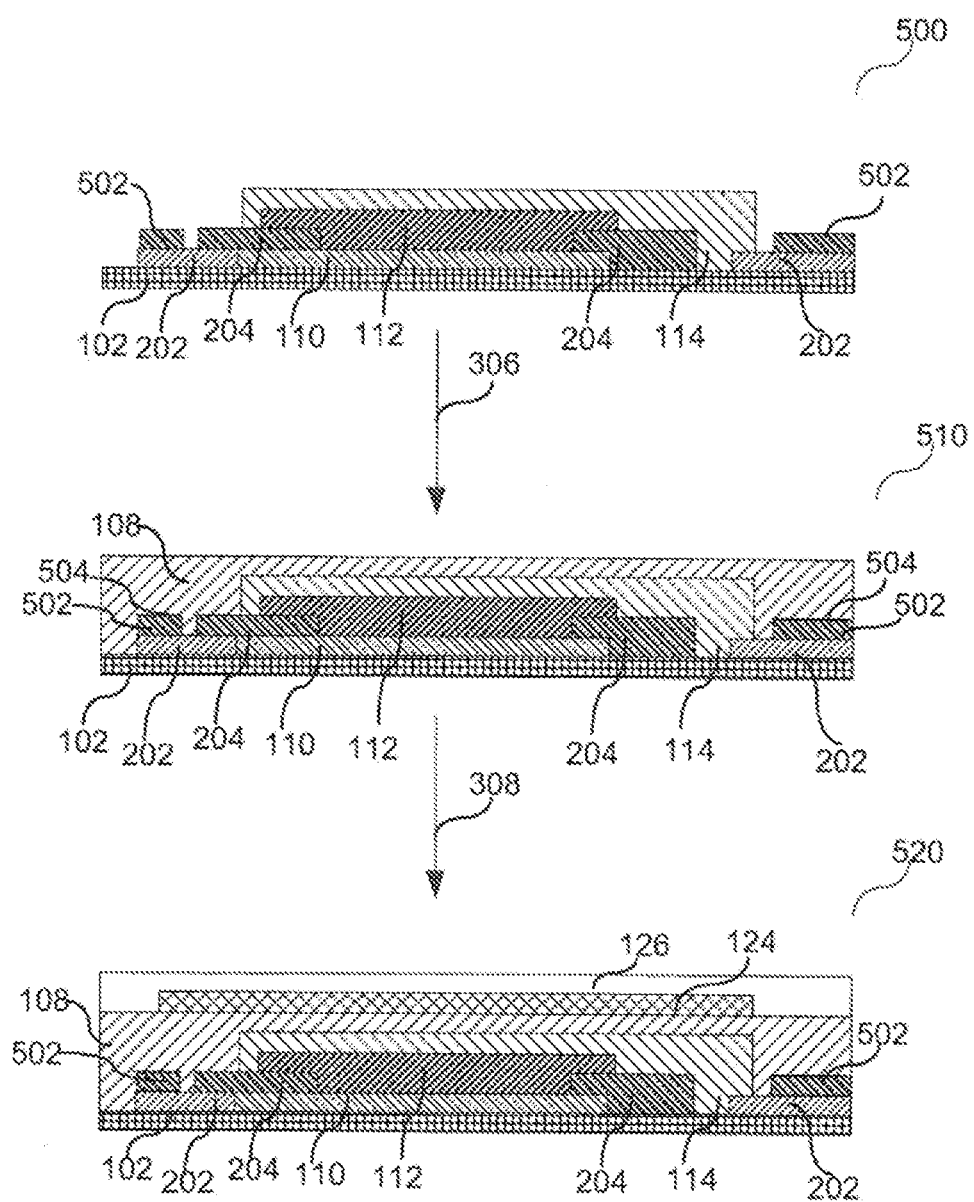
FIG. 5 shows schematic cross sections of an optoelectronic component in a method for producing an optoelectronic component, according to various configurations.

FIG. 5 shows schematic cross sections of an optoelectronic component in a method for producing an optoelectronic component, according to various configurations.

Schematic cross sections 500, 510, 520 of an optoelectronic component of the various steps of the method 300 for producing an optoelectronic component are represented.

The substrate may for example be configured in a similar way or in the same way as one of the configurations of the description of FIG. 1 and/or FIG. 2, and may include: a carrier 102, a first electrode 110, an organic functional layer structure 112, a second electrode 114, at least one contact pad 202 and resist 204.

In a similar way or in the same way as the configuration of the description of FIG. 4, a first layer 502 may be applied onto at least one region 408 of the substrate.

The first layer 502 may, for example, be configured in terms of substance in a similar way or in the same way as the resist 204.

The first layer 502 may, for example, be applied onto the substrate in the same method step as the resist.

The substrate may in this case be understood as a base, with which the first layer 502 shares a common interface in a similar way or in the same way as the interface 404 of one of the configurations of the description of FIG. 4. The surface of the substrate may have a locally different substance composition in different regions.

The method may include formation 306 of a second layer 108 on or over the first layer 502.

The second layer 108 may, for example, be configured in a similar way or in the same way as the encapsulation 108 of one of the configurations of the description of FIG. 1.

The second layer 108 may, for example, be applied onto the substrate in such a way that the second layer 108 can form a continuous surface on the carrier 102.

The second layer 108 may share at least one common interface 504 with the first layer 502.

After the formation 306 of a second layer 108 over or on a first layer 502, the method may include formation 308 of further layers 124, 126 on or over the second layer 108.

Figure 6:
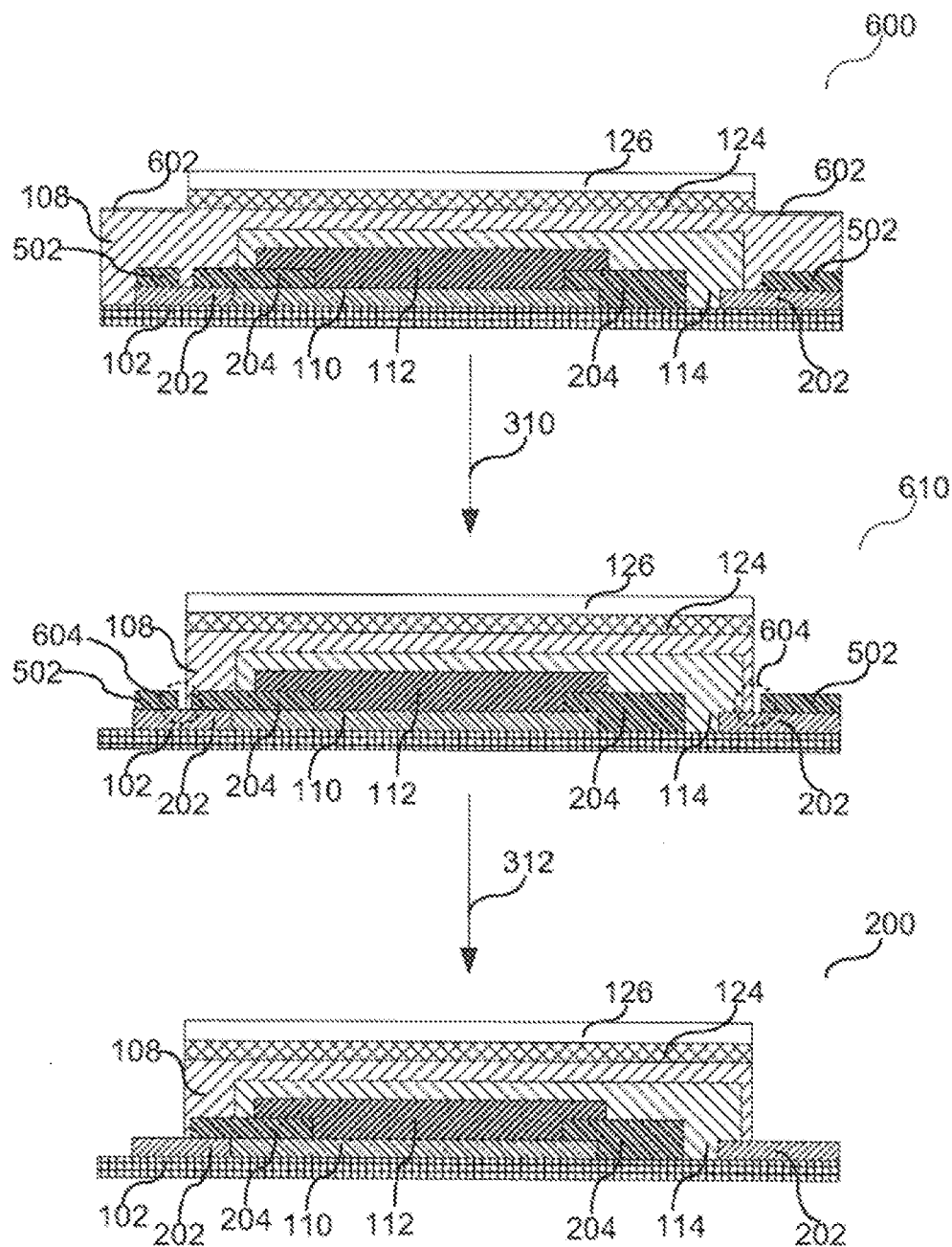
FIG. 6 shows schematic cross sections of an optoelectronic component in a method for producing an optoelectronic component, according to various configurations.

FIG. 6 shows schematic cross sections of an optoelectronic component in a method for producing an optoelectronic component, according to various configurations.

Schematic cross sections 600, 610, 200 of an optoelectronic component of the various steps of the method 300 for producing an optoelectronic component are represented.

The substrate may for example be configured in a similar way or in the same way as one of the configurations of the description of FIG. 1 and/or FIG. 2, and may include: a carrier 102, a first electrode 110, an organic functional layer structure 112, a second electrode 114, at least one contact pad 202 and resist 204.

The schematic cross section 600 represents an optoelectronic component in a similar way or in the same way as the cross section of a configuration 520 of the description of FIG. 5.

The further layers 124, 126 may be patterned, for example by the surface 602 of the second layer 108 being at least partially exposed.

The method 300 may include removal 310 of the second layer 108 in at least one region of the substrate, for example by the first layer 502 being exposed in at least one region 408 (not represented, see for example FIG. 4).

The removal 310 may for example include an etching process, for example wet chemical or dry chemical etching; mechanical removal, for example scratching, or ballistic removal, according to one of the configurations of the description of FIG. 3.

The first layer 502 may be connected without change to the substrate during the at least partial removal 310 of the second layer, for example by the first layer 502 being configured to be inert in relation to the process for the removal 310 of the second layer 108.

The second layer 108 may be removed in such a way that layers of the optoelectronic component, for example a resist 204 and/or a second electrode 114, are laterally encapsulated, for example in the intermediate region 604 between the first layer 502 and the neighboring layer 204, 114. The encapsulation 108 may, for example, prevent diffusion of harmful substances, for example water and/or oxygen, into the layers within the encapsulation (114, 112, 204).

The method 300 may include removal 312 of the first layer 502 after or with the removal 310 of the second layer 108 from at least one region of the substrate (408, FIG. 4).

The second layer 108 in the at least one region (408) may, however, also be removed with the first layer 502.

After the removal 312 of the first layer 502 from the at least one region of the substrate, the at least one region may be exposed.

The at least one exposed region may for example include a contact pad 202, which may be configured for electrical connection of the optoelectronic component 100.

The first layer 502 may in this case protect the contact pad 202 in the at least one region 408 against the process of the removal 310 of the second layer, for example against erosion of the substance or of the substance mixture of the contact pad 202.

The first layer 502 may be removed from the substrate, in relation to the second layer 108, in such a way that the impairment of the contact pads 202 after removal 312 of the first layer 502 is configured to be less than in the case of removal 310 of the second layer 108 from the surface of the substrate.

In this way, the quality of the surface of the substrate in the at least one region 408 can be maintained during the removal 310 of the second layer 108.

The removal 312 of the first layer from the surface of the at least one region of the substrate may include a process which reduces the adhesion of the first layer 502, for example irradiation of the first layer with electromagnetic radiation, for example UV radiation.

By the contact pads 202, an electrical connection can be formed between an external power supply (not represented) and the optoelectronic component 200.

In order to form physical and/or electrical contact of external electrical terminals, for example of a flexible printed circuit board (not represented), with the at least one contact pad 202, the first layer 502 may be removed from the contact pad 202 or contacting may be formed through the first layer 502, for example when the first layer 502 is configured to be electrically conductive and/or is formed from a substance which can be mechanically displaced by the electrical terminals.

Figure 7:
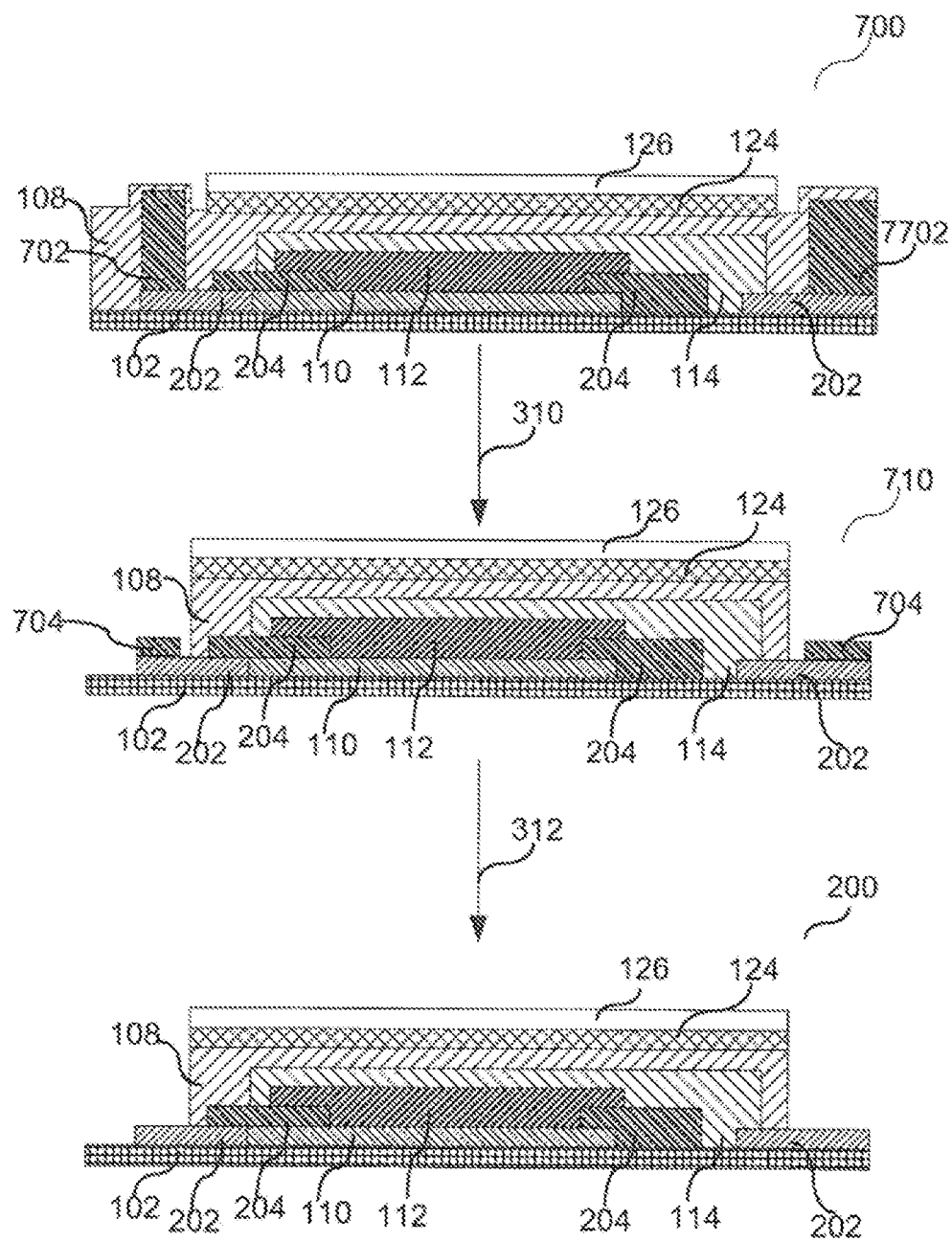
FIG. 7 shows schematic cross sections of an optoelectronic component in a method for producing an optoelectronic component, according to various configurations.

FIG. 7 shows schematic cross sections of an optoelectronic component in a method for producing an optoelectronic component, according to various configurations.

Schematic cross sections 700, 710, 200 of an optoelectronic component of the various steps of the method 300 for producing an optoelectronic component are represented.

The substrate may for example be configured in a similar way or in the same way as one of the configurations of the description of FIG. 1 and/or FIG. 2, and may include: a carrier 102, a first electrode 110, an organic functional layer structure 112, a second electrode 114, at least one contact pad 202 and resist 204.

If the first layer 702 is intended to be partially removed as well during the removal 310 of the second layer 108, the layer thickness of the first layer 702 in the at least one region of the substrate may be adapted in such a way that after removal 310 of the second layer 108 at least a part of the first layer 704 remains on the substrate—as represented in the cross-sectional view 710.

The part 706 of the first layer remaining on the substrate may, however, be removed by a process which has a lesser effect on the properties of the surface of the substrate than the process for the removal 310 of the second layer 108.

The thickness of the first layer 702 may have a value in a range of from approximately 10% to approximately 400% of the thickness of the second layer 108.

The specific thickness of the first layer 702 may be dependent on the substance composition of the first layer 702 and of the second layer 108, as well as the specific process for the removal 310 of the second layer.

FIG. 8 shows schematic plan views of a mask and of an optoelectronic component in a method for producing an optoelectronic component, according to various configurations.

A mask 802 for forming an optoelectronic component is represented in the plan view 800.

The mask 802 may include a plurality of openings 804. The plurality of openings 804 may be configured for simultaneous formation of the first layer on at least one region of a substrate and at least one layer of an optoelectronic component on the substrate.

The view 810 represents a plan view 810 of a configuration of an optoelectronic component similar to or the same as the configuration 400 of the cross-sectional view 400 of one of the configurations of the description of FIG. 4.

A carrier 102, a second electrode 114, contact pads 202 and a first layer 402 are represented. The configuration represented is to be understood as an example for illustration. The carrier 102, the electrically active region 106 and the at least one region 408 of the substrate with the first layer 402 may have any desired geometrical shape, for example round, elliptical, square, rectangular, hexagonal and/or polygonal.

A substrate may include a plurality of regions 408, on which a first layer 402 may be applied, for example one, two, three, four (as represented), five, six or more regions. The plurality of regions may in this case be independent of one another, i.e. not continuous.

Figure 9:
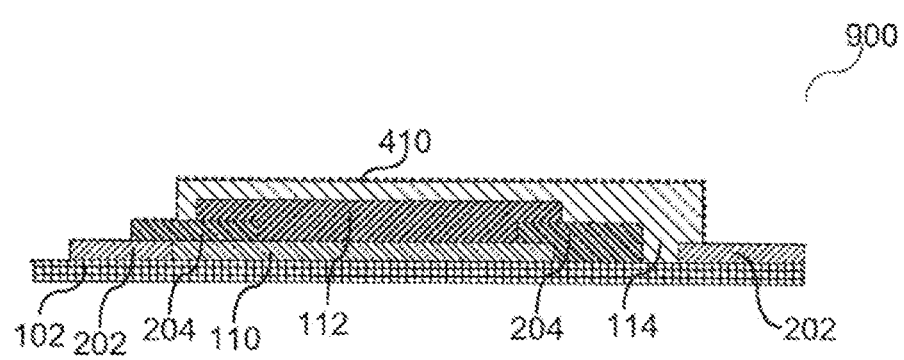
FIG. 9 shows schematic cross sections of an optoelectronic component in a method for producing an optoelectronic component, according to various configurations.

FIG. 9 shows schematic cross sections of an optoelectronic component in a method for producing an optoelectronic component, according to various configurations.

A partially completed optoelectronic component is represented in the schematic cross-sectional view, before the application of the first and second layers, according to various configurations.

In various embodiments, a method for producing an optoelectronic component and a method for patterning an organic optoelectronic component are provided, with which it is possible to produce OLED components with reproducible optoelectronic properties by undamaged contact pads and reproducibly pattern the light field of OLED components.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an organic optoelectronic component, the method comprising:
    forming a first layer on a substrate, the first layer comprising a substance or a substance mixture, wherein the first layer is in a physical contact with the substrate, the substrate comprising at least one contact pad of the organic optoelectronic component, at least one electrode of the organic optoelectronic component being electrically connected to the at least one contact pad;

forming a second layer on or over the substrate, the second layer comprising a substance or a substance mixture, wherein the second layer is in at least one region of the substrate in a physical contact with the first layer; and removing at least the second layer in at least one region of the substrate with the first layer and the contact pad;

wherein the substance or of the substance mixture of the first layer has a lesser adhesion to the substrate than the substance or of the substance mixture of the second layer has to the substrate.

2. The method as claimed in claim 1, wherein the adhesion of the first layer with the substrate being lower than the adhesion of the substance or of the substance mixture of the second layer on the interface with the substrate is formed by a process.

3. The method as claimed in claim 2, wherein the process comprises at least one process step from the group of process steps:

separating regions of the first layer and/or second layer;

bombardment of the first layer and/or second layer with electrons, ions, photons or the like;

a wet chemical process, a dry chemical process, chemical-mechanical polishing, etching or the like.

4. The method as claimed in claim 1, wherein the lower adhesion of the first layer is formed before or after the removal of the second layer.

5. The method as claimed in claim 1, wherein the second layer is removed in the at least one region by removing the first layer in the at least one region.

6. The method as claimed in claim 1, wherein the first layer is resistant during the removal of the second layer.

7. The method as claimed in claim 1, wherein a part of the first layer is removed during the removal of the second layer.

8. The method as claimed in claim 1, wherein the removal of the second layer comprises at least one process from the group of processes:

ballistic removal;

mechanical removal; and/or chemical removal.

9. The method as claimed in claim 1, wherein the second layer is configured as an encapsulation layer of the optoelectronic component.

10. The method as claimed in claim 1, configured for the exposure of at least one contact pad of an optoelectronic component.

11. A method for patterning an organic optoelectronic component, the method comprising:

forming a first layer on an organic functional layer structure of the organic optoelectronic component, the first layer comprising a substance or a substance mixture wherein the first layer is in a physical contact with the organic functional layer structure;

forming a second layer on or over the organic functional layer structure, the second layer comprising a substance or a substance mixture, wherein the second layer is in a physical contact with the first layer; and removing at least the second layer in at least one region with the first layer on or over the organic functional layer structure;

wherein the substance or of the substance mixture of the first layer has a lesser adhesion to the organic functional layer structure the substance or of the substance mixture of the second layer to the organic functional layer structure.

12. The method as claimed in claim 11, configured for lateral patterning of the surface of an optoelectronic component.

13. The method as claimed in claim 11, configured for lateral patterning of the surface of an organic light-emitting diode.

* * * * *